(12) United States Patent
Shin et al.

(10) Patent No.: US 7,135,407 B2
(45) Date of Patent: Nov. 14, 2006

(54) METHOD OF MANUFACTURING A SEMICONDUCTOR DEVICE

(75) Inventors: Ju-Cheol Shin, Seoul (KR); Hong-Mi Park, Gyeonggi-do (KR); In-Sun Park, Gyeonggi-do (KR); Hyeon-Deok Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 74 days.

(21) Appl. No.: 10/816,989

(22) Filed: Apr. 1, 2004

(65) Prior Publication Data

US 2004/0198041 A1    Oct. 7, 2004

(30) Foreign Application Priority Data

Apr. 1, 2003    (KR) .................. 10-2003-0020595

(51) Int. Cl.
*H01L 21/44* (2006.01)

(52) U.S. Cl. ..................... 438/679; 438/795

(58) Field of Classification Search ................ 438/635, 438/648, 656–660, 685, 768, 785, 679, 795
See application file for complete search history.

(56) References Cited

U.S. PATENT DOCUMENTS

| 5,084,417 | A | * | 1/1992 | Joshi et al. ................. 438/653 |
| 6,022,586 | A | * | 2/2000 | Hashimoto et al. ......... 427/237 |
| 6,214,731 | B1 | | 4/2001 | Nogami et al. |
| 2002/0098648 | A1 | * | 7/2002 | Ludwig et al. ............. 438/257 |
| 2004/0132265 | A1 | * | 7/2004 | Maruyama et al. ......... 438/458 |

* cited by examiner

*Primary Examiner*—Calvin Lee
(74) *Attorney, Agent, or Firm*—Marger Johnson & McCollom, P.C.

(57) ABSTRACT

In a method of manufacturing a semiconductor device, a tungsten layer pattern having an oxidized surface is formed on a substrate. A source gas including silicon is provided to the oxidized surface of the tungsten layer pattern to form a protecting layer on the oxidized surface of the tungsten layer pattern. The protecting layer prevents an abnormal growth of oxide contained in the oxidized surface. The protecting layer prevents a whisker from growing from the oxidized surface of the tungsten layer pattern.

18 Claims, 13 Drawing Sheets

METHOD OF MANUFACTURING A SEMICONDUCTOR DEVICE

CROSS REFERENCE TO RELATED APPLICATION

This application claims priority under 35 USC § 119 to Korean Patent Application No. 2003-20595 filed on Apr. 1, 2003, the contents of which are herein incorporated by reference in their entirety for all purposes.

BACKGROUND OF THE INVENTION

1. Field of the Invention

The present invention relates to a method of manufacturing a semiconductor device. More particularly, the present invention relates to a method of manufacturing a semiconductor device having a tungsten pattern.

2. Description of the Related Art

Since highly-integrated semiconductor device has been required to process mass information, a design rule of the semiconductor device has been rapidly reduced. A width of wirings and an interval between the wirings in the semiconductor device have been reduced so much that resistances of conductive patterns and lines used as the wirings have been remarkably augmented. To rapidly process the mass information, however, it is important to improve an operation speed of the semiconductor device by reducing the resistances of the conductive lines. Thus, forming the wirings using a conductive material having a low resistance is required.

Typically, the conductive patterns, e.g., a gate electrode or a bit line, may include polysilicon or metal silicide. However, polysilicon or metal silicide may have a relatively high resistance when reflected on development trend point view of the semiconductor device. Recently, methods for forming a conductive pattern using tungsten has been studied and developed. Tungsten may have a low resistance and a stability that is comparable to polysilicon or metal silicide.

In a conventional method for forming a semiconductor device using tungsten, a tungsten layer is formed on a substrate. A photoresist layer is formed on the tungsten layer. The photoresist layer is patterned through a photolithography process to form a photoresist pattern.

The tungsten layer is etched using the photoresist pattern as an etching mask to form a tungsten layer pattern. The photoresist pattern remaining on the tungsten layer pattern is removed by an ashing process or a stripping process. Here, a thin tungsten oxide layer is formed on the tungsten layer pattern during the etching process, the ashing process and the stripping process. Since tungsten is rapidly reacted with oxygen, tungsten may be readily oxidized. Subsequently, when the tungsten layer pattern is thermally treated under oxygen atmosphere, the tungsten oxide layer grows abnormally to create a whisker that includes W18049 on the tungsten layer pattern.

Figure 1:
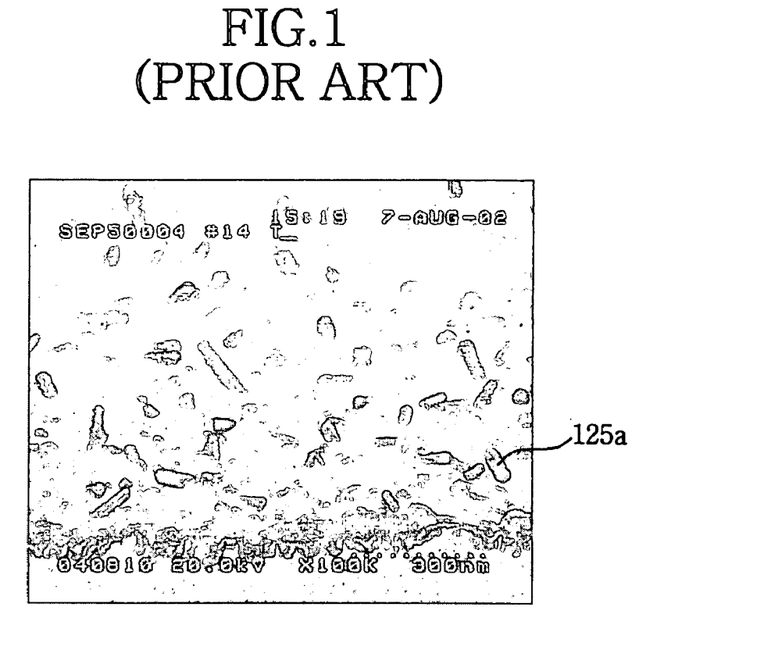
FIG. 1 is an SEM picture showing a surface of a tungsten layer having a whisker.

FIG. 1 is a scanning electron microscope (SEM) picture showing a surface of a tungsten layer on which a whisker is formed.

Referring to FIG. 1, a whisker 125a irregularly grows in every direction on several portions of a tungsten layer so that the tungsten layer has an uneven surface. Due to the whisker 125a, a subsequent layer may not be formed uniformly on the tungsten layer.

Figure 2:
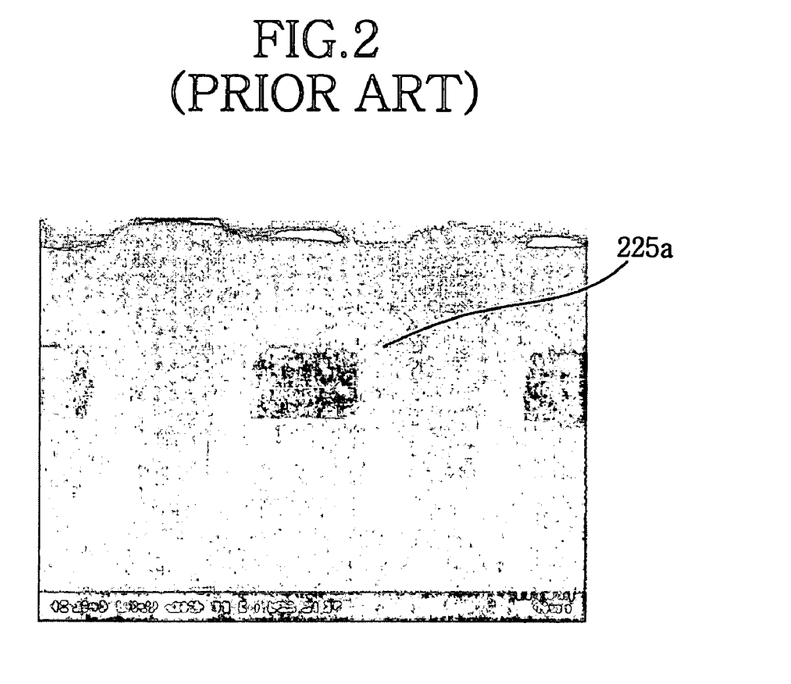
FIG. 2 is an SEM picture showing a cross section of a semiconductor device having a tungsten layer.

FIG. 2 is an SEM picture showing a cross section of a semiconductor device having a tungsten pattern.

Referring to FIG. 2, when tungsten layer pattern is formed by a photolithography process, a tungsten oxide layer is formed on the tungsten layer pattern. When a spacer including oxide or nitride is formed on a sidewall of the tungsten layer pattern, the tungsten oxide layer grows to form a whisker 225a during formation of the spacer. That is, when the tungsten layer pattern is continuously and thermally treated, the tungsten oxide layer is reacted with oxygen, and then abnormally grows to form the whisker 225a that is protrudes from the tungsten layer pattern.

The whisker may be electrically connected to a conductive pattern adjacent to the whisker to cause a short between the tungsten layer pattern and the conductive pattern. Embodiments of the invention address these and other disadvantages of the conventional art.

SUMMARY OF THE INVENTION

The present invention provides a method of manufacturing a semiconductor device for preventing a whisker from forming on a tungsten layer pattern in the semiconductor device.

In a method of manufacturing a semiconductor device according to one aspect of the present invention, a tungsten layer pattern having an oxidized surface is formed on a substrate. A source gas including silicon is provided to the oxidized surface of the tungsten layer pattern to form a protecting layer on the oxidized surface of the tungsten layer pattern. The protecting layer prevents an abnormal growth of oxide contained in the oxidized surface.

In a method of manufacturing a semiconductor device according to another aspect of the present invention, a tungsten layer is formed on a substrate. A photoresist pattern is formed on the tungsten layer to partially expose the tungsten layer. The tungsten layer is selectively etched using the photoresist pattern as an etching mask to form a tungsten layer pattern on the substrate. The photoresist pattern is removed to expose the tungsten layer pattern. A source gas including silicon is provided to the tungsten layer pattern to form a protecting layer on the tungsten layer pattern. The protecting layer prevents an abnormal growth of the oxide contained in an oxidized surface of the tungsten layer pattern. The substrate is thermally treated after forming the protecting layer.

According to the present invention, the protecting layer is formed on the oxidized surface of the tungsten layer pattern so that a whisker may not grow from the oxidized surface of the tungsten layer pattern.

BRIEF DESCRIPTION OF THE DRAWINGS

The above and other features and advantages of the invention will become readily apparent by reference to the following detailed description when considered in conjunction with the accompanying drawings wherein.

DESCRIPTION OF THE PREFERRED EMBODIMENTS

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to similar or identical elements throughout. It will be understood that when an element such as a layer, region or substrate is referred to as being "on" or "onto" another element, it can be directly on the other element or intervening elements may also be present.

In a method of manufacturing a semiconductor device according to one embodiment, a tungsten layer pattern is formed on a substrate. The substrate is treated by a thermal process to form a thin tungsten oxide layer on a surface of the tungsten layer pattern.

A source gas including silicon is provided to the surface of the tungsten layer pattern to form a protecting layer having a thickness of about 1 Å to about 100 Å between the tungsten layer pattern and the tungsten oxide layer. The protecting layer prevents an abnormal growth of oxide contained in the tungsten layer pattern. To form the protecting layer, a silane (SiH4) gas is introduced into the surface portion of the tungsten layer pattern at a flow rate of about 10 sccm to about 1,000 sccm and at a temperature of about 300° C. to about 600° C. Silicon contained in the silane gas is reacted with the heated surface of the tungsten layer pattern through the tungsten oxide layer to form the protecting layer. Alternatively, energy may be applied to the source gas to form silicon ions. The silicon ions may be implanted into the surface portion of the tungsten layer pattern through the tungsten oxide layer to form the protecting layer.

The substrate is thermally treated at a temperature of about 300° C. to about 1,100° C. after forming the protecting layer.

In a method of manufacturing a semiconductor device according to another embodiment, a tungsten layer is formed on a substrate. A photoresist pattern is formed on the tungsten layer to partially expose portions of the tungsten layer. The exposed portions of the tungsten layer are selectively etched using the photoresist pattern as an etching mask to form a tungsten layer pattern. The photoresist pattern is removed by an ashing process and a stripping process. A tungsten oxide layer is formed on the tungsten layer pattern.

A source gas including silicon is provided to the surface of the tungsten layer pattern to form a protecting layer having a thickness of about 1 Å to about 100 Å on the surface of the tungsten layer pattern. The protecting layer prevents an abnormal growth of oxide contained in the tungsten oxide layer pattern. A silane (SiH4) gas is introduced onto the surface portion of the tungsten layer pattern at a flow rate of about 10 sccm to about 1,000 sccm at a temperature of about 300° C. to about 600° C., thereby forming the protective layer. Silicon contained in the silane gas is reacted with the heated surface of the tungsten layer pattern through the tungsten oxide layer to form the protecting layer.

The substrate is thermally treated at a temperature of about 300° C. to about 1,100° C. after forming the protecting layer.

Figure 3A:
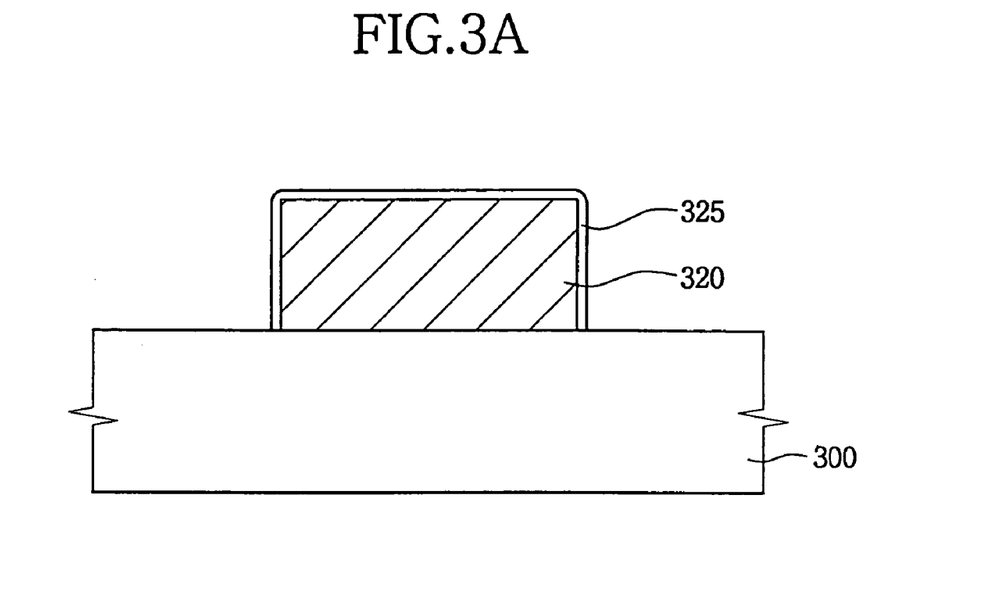
FIGS. 3A to 3C are cross sectional views illustrating a method for forming a tungsten layer pattern according to one embodiment of the present invention.
Figure 3B:
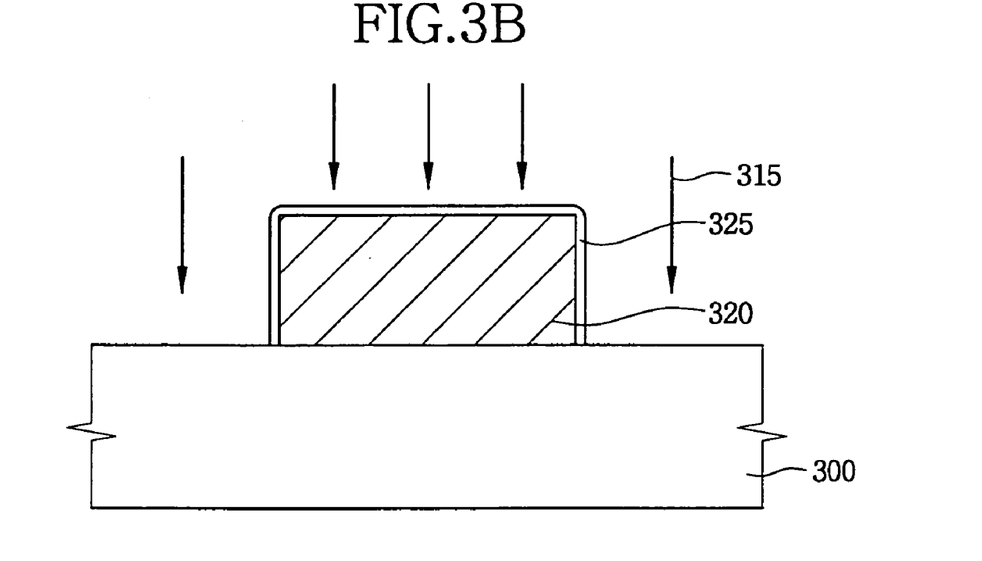
Figure 3C:
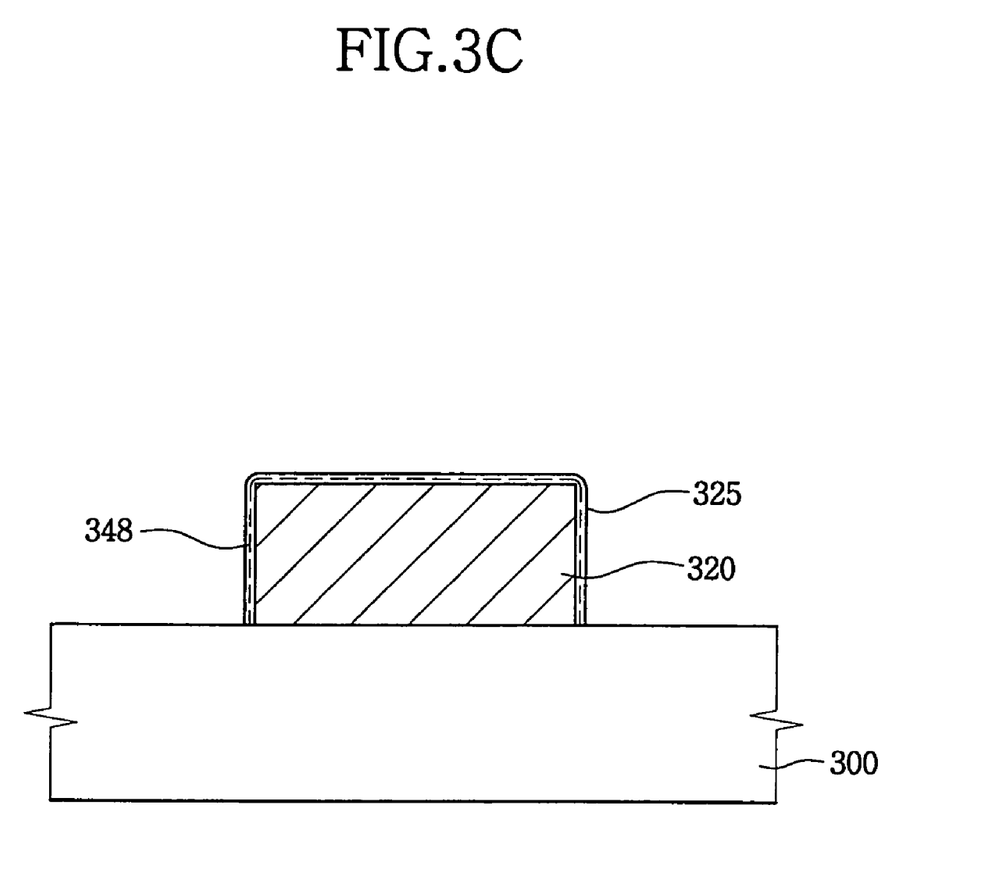

FIGS. 3A to 3C are cross sectional views illustrating a method for forming a tungsten layer pattern according to one embodiment of the present invention.

Referring to FIG. 3A, a tungsten layer pattern 320 is formed on a substrate 300. A thin tungsten oxide layer 325 is formed on the tungsten layer pattern 320 by an oxygen plasma process or a rapid thermal oxidation process.

Referring to FIG. 3B, a silane gas 315 is introduced onto a surface of the tungsten layer pattern 320 at a flow rate of about 10 sccm to about 1,000 sccm and at a temperature of about 300° C. to about 600° C. When the silane gas is introduced at a temperature of below about 300° C., silicon contained in the silane gas may not react with the surface of the tungsten layer pattern 320 through the tungsten oxide layer 325. On the other hand, when the silane gas is introduced at a temperature of above about 600° C., oxide contained in the tungsten oxide layer 325 may grow more rapidly than infiltration of silicon. Accordingly, the silane gas is introduced onto the tungsten layer pattern 320 at the temperature in a range of about 300° C. to about 600° C. When the silane gas is introduced at a flow rate of below about 10 sccm, the desired amounts of silicon may not react with the surface of the tungsten layer pattern 320 through the thin tungsten oxide layer 325. Accordingly, the flow rate of the silane gas may be preferably adjusted in a range of about 10 sccm to about 1,000 sccm.

Referring to FIG. 3C, the silane gas reacts with the surface of the tungsten layer pattern 320 to form a protecting layer 348 including silicon. That is, the protecting layer 348 is formed between the tungsten layer pattern 320 and the tungsten oxide layer 325. The protecting layer 348 has a thickness of about 1 Å to about 100 Å. When the thickness of the protecting layer 348 is below about 1 Å, a whisker may be formed on the surface of the tungsten layer pattern 320. Accordingly, the protecting layer 348 preferably has a thickness of about 1 Å to about 100 Å. Alternatively, energy may be applied to the source gas to form silicon ions. The silicon ions may be implanted into the surface portion of the tungsten layer pattern 320 to form the protecting layer 348.

The substrate 300 is thermally treated at a temperature of about 300° C. to about 1,100° C. after the protecting layer 348 is formed.

COMPARATIVE EXAMPLE

Figure 4A:
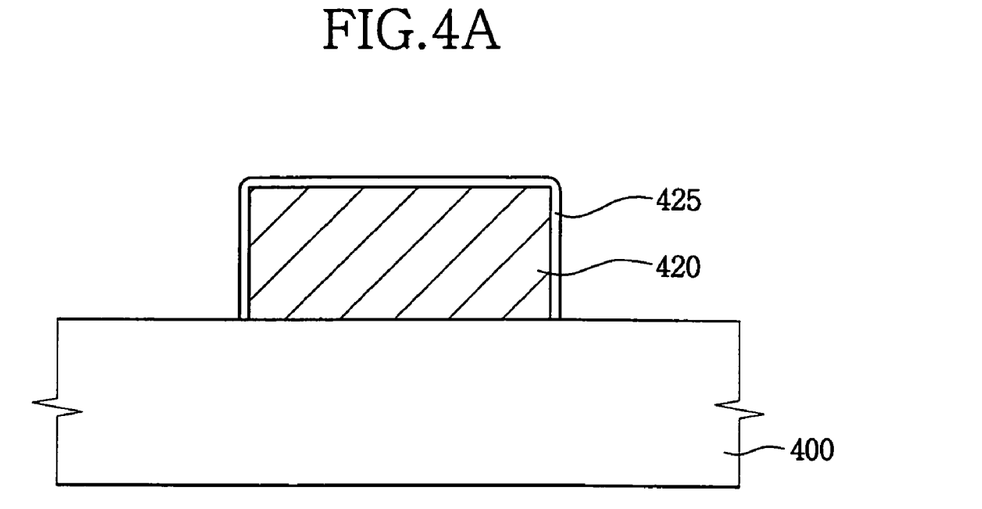
FIGS. 4A and 4B are cross sectional views illustrating a method for forming tungsten layer pattern according to Comparative Example.
Figure 4B:
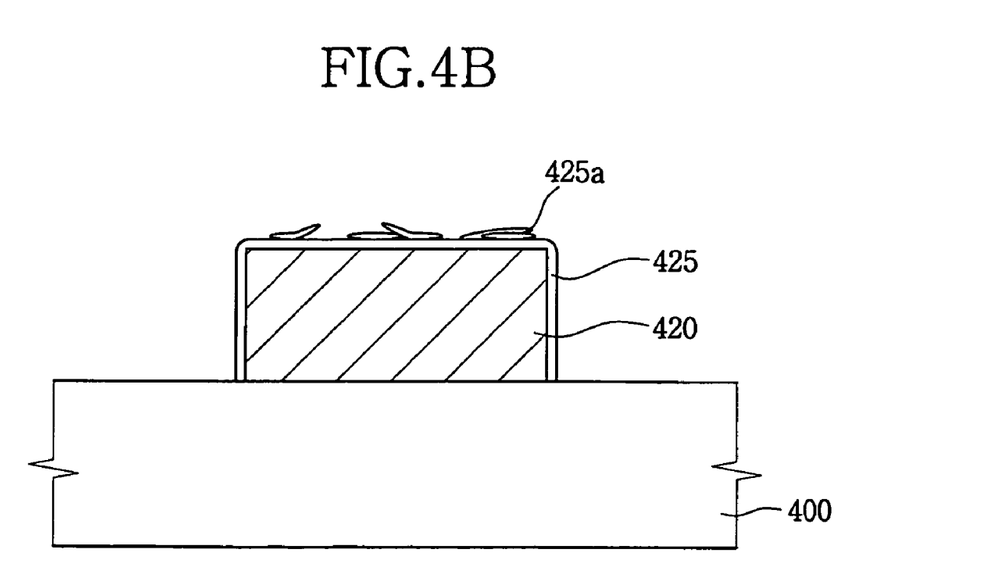

FIGS. 4A and 4B are cross sectional views illustrating a method for forming tungsten layer pattern according to Comparative Example.

Referring to FIG. 4A, a tungsten layer pattern 420 is formed on a substrate 400. A thin tungsten oxide layer 425 is formed on a surface of the tungsten layer pattern 420 by an oxygen plasma process or a rapid thermal oxidation process.

Referring to FIG. 4B, the surface of the tungsten layer pattern 420 is thermally treated at a temperature of about 300° C. to about 1,110° C. The tungsten oxide layer 425 grows to disadvantageously form a whisker 425a.

FIGS. 5A to 5G are cross sectional views illustrating a method of manufacturing a semiconductor device according to one embodiment the present invention.

Figure 5A:
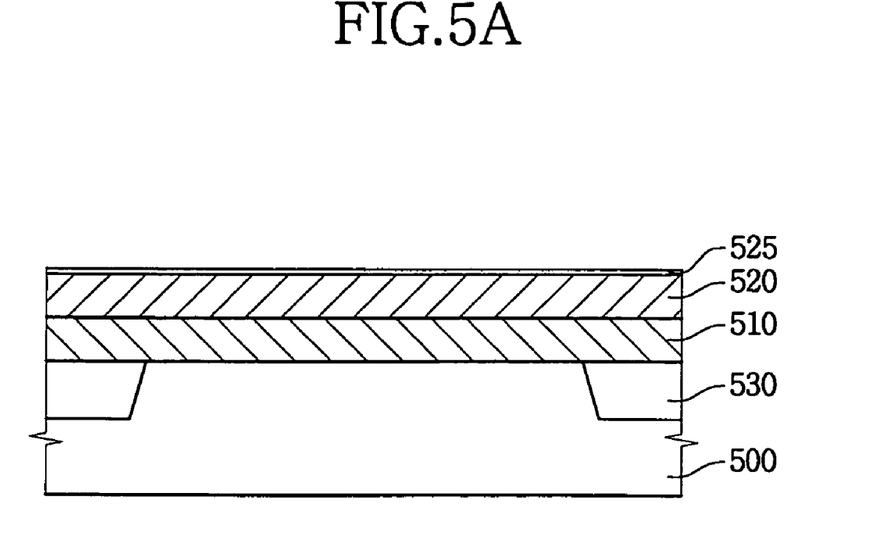
FIGS. 5A to 5G are cross sectional views illustrating a method of manufacturing a semiconductor device according to one embodiment the present invention.

Referring to FIG. 5A, a trench is formed in a substrate 500 by a shallow trench isolation (STI) process. The trench is filled with an oxide layer to define a field region 530. An active region (not shown) is simultaneously defined in accordance with the formation of the field regions 530.

A gate oxide layer is formed on the substrate 500. A polysilicon layer is formed on the gate oxide layer. Impurities having a high concentration are doped into the polysilicon layer to form a doped polysilicon layer 510. Tungsten is deposited on the doped polysilicon layer 510 to form a tungsten layer 520. Since tungsten is readily reacted with oxygen, a first native oxide layer 525 is formed on the surface of the tungsten layer 520.

Figure 5B:
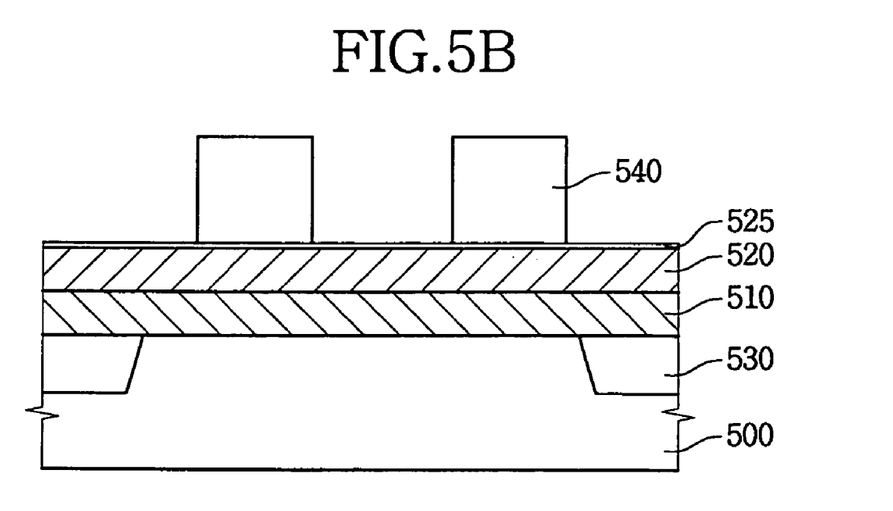

Referring to FIG. 5B, a photoresist layer is formed on the tungsten layer 520. The photoresist layer is exposed and developed to form a photoresist pattern 540 on the first native oxide layer 525.

Figure 5C:
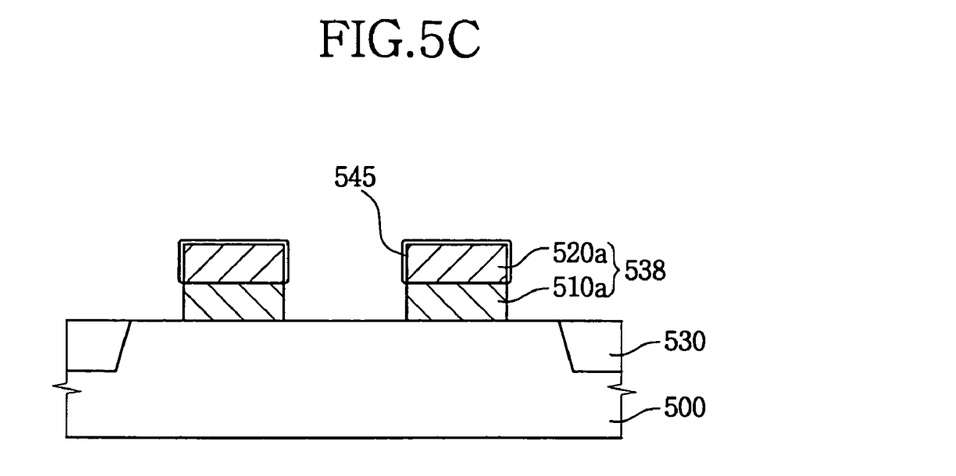

Referring to FIG. 5C, the first native oxide layer 525, the tungsten layer 520, the doped polysilicon layer 510 and the gate oxide layer are partially etched using the photoresist pattern 540 as an etching mask to form a gate pattern 538 including a tungsten layer pattern 520a, a doped polysilicon layer pattern 510a and a gate oxide layer pattern (not shown). Alternatively, the gate pattern 538 may be formed using a hard mask pattern after the hard mask pattern is formed on the first native oxide layer 525.

The photoresist pattern 540 is removed by an ashing process and a stripping process. Here, the ashing process is performed using oxygen or ozone plasma. Accordingly, a second native oxide layer 545 including tungsten oxide is formed on an upper face and a side face of the tungsten layer pattern 520a.

Generally, the photoresist pattern 540 may be removed by a dry etching process using an oxidizer, for example, such as oxygen or ozone. However, the oxidizer may be provided to the photoresist pattern 540 at a temperature of above about 100° C. so that the second native oxide layer 545 is formed on the side face of the tungsten layer pattern 520a. When the second native oxide layer 545 is thermally treated continuously, oxide contained in the second native oxide layer 545 abnormally grows to form a whisker causing a short between adjacent a conductive pattern and the tungsten layer pattern 520a.

Figure 5D:
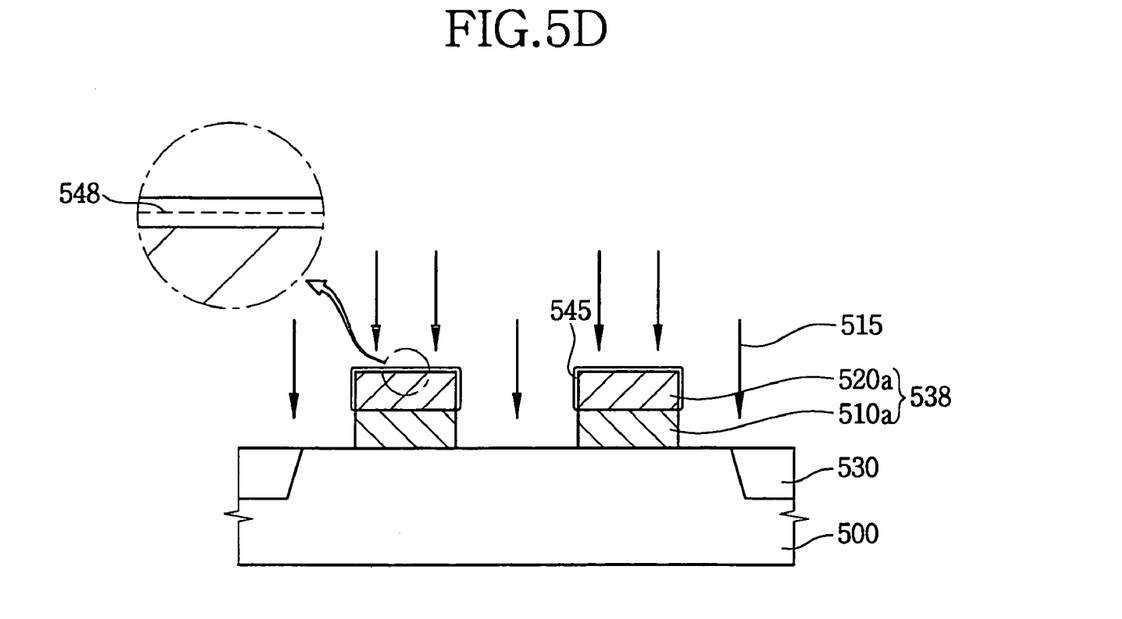

Referring to FIG. 5D, a silane gas 515 is introduced onto the tungsten layer pattern 520a at a flow rate of about 10 sccm to about 1,000 sccm at a temperature of about 300° C. to about 600° C. Silicon contained in the silane gas 515 reacts with the tungsten layer pattern 520a through the second native oxide layer 545 to form a protecting layer 548 that includes silicon and has a thickness of about 1 Å to about 100 Å on the tungsten layer pattern 520a. The protecting layer 548 is formed between the tungsten layer pattern 520a and the second native oxide layer 545.

Figure 5E:
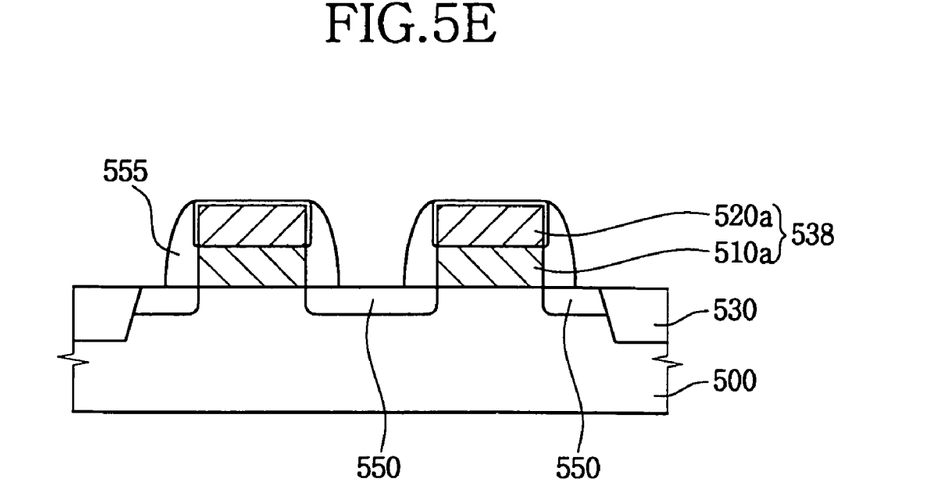

Referring to FIG. 5E, source/drain regions 550 are formed at a surface of the substrate 500 adjacent to the gate pattern 538 by an ion implantation process. An insulating layer is formed on the gate pattern 538 and the substrate 500 at a temperature of about 300° C. to about 1,100° C. Without the protecting layer 548, oxide contained in the second native oxide layer 545 may abnormally grow to form the whisker. The protecting layer 548, however, suppresses the growth of oxide, thereby preventing the formation of the whisker. The insulating layer is anisotropically etched to form a gate spacer 555 on a sidewall of the gate pattern 538.

Figure 5F:
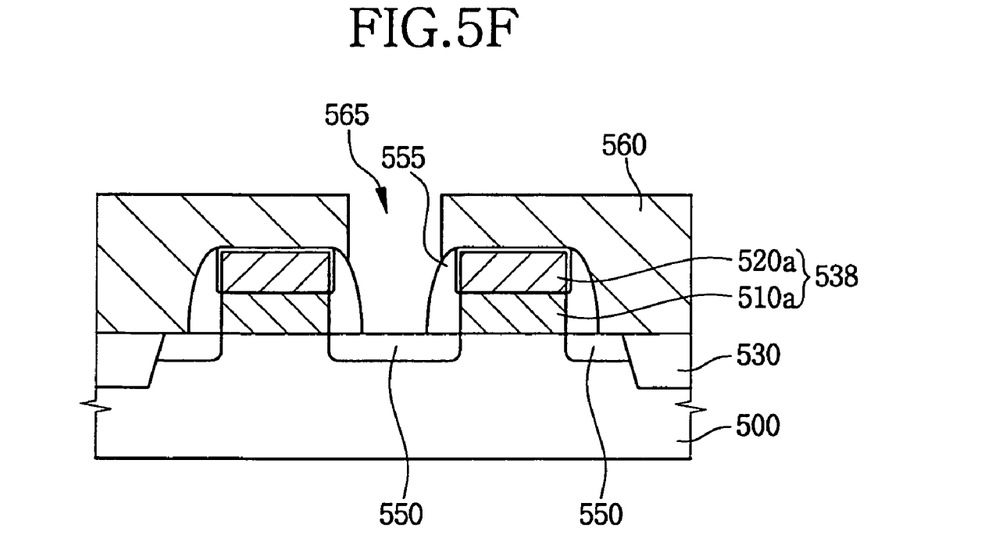

Referring to FIG. 5F, an insulating interlayer 560 is formed on a resultant structure. The insulating interlayer 560 is partially etched to form a contact hole 565 exposing the source/drain region 550 of the substrate 500 between the gate patterns 538.

Figure 5G:
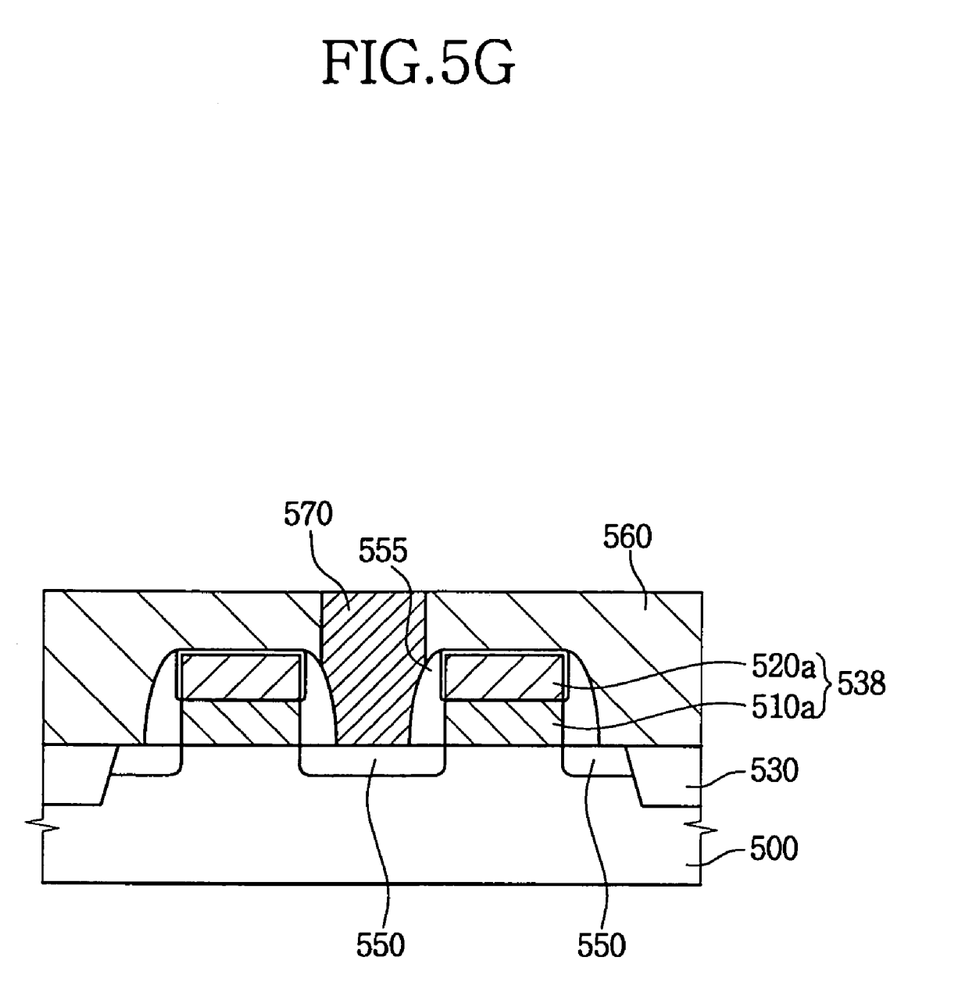

Referring to FIG. 5G, a conductive polysilicon layer is formed on the insulating interlayer 560 to fill the contact hole 565. The conductive polysilicon layer is planarized by a chemical mechanical polishing (CMP) process for exposing an upper face of the insulating interlayer 560 to form a contact plug 570 in the contact hole.

FIGS. 6A to 6G are cross sectional views illustrating a method of manufacturing a semiconductor device according to another embodiment the present invention.

Figure 6A:
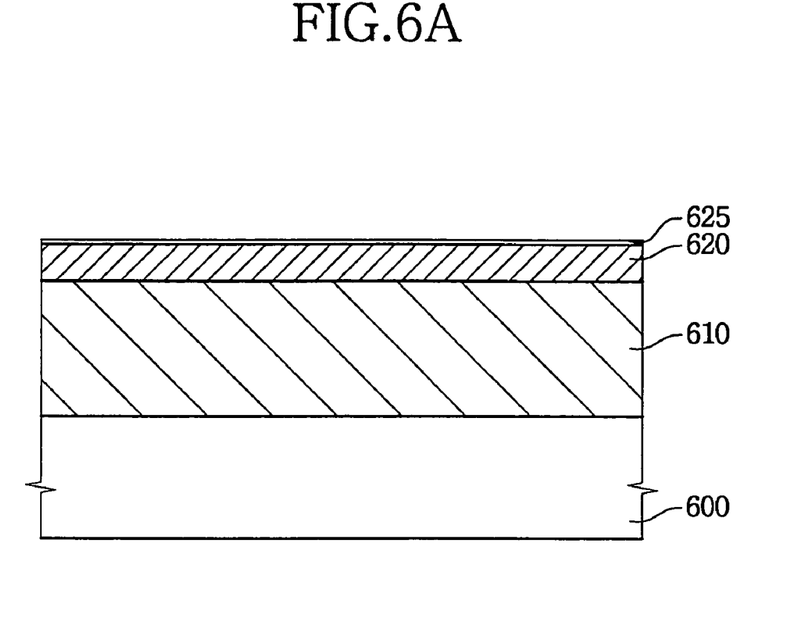
FIGS. 6A to 6G are cross sectional views illustrating a method of manufacturing a semiconductor device according to another embodiment the present invention.

Referring to FIG. 6A, a field region (not shown) and an active region (not shown) are defined on a substrate 600 by a shallow trench isolation (STI) process. A gate electrode (not shown) including a gate oxide layer pattern and a doped polysilicon layer pattern is formed on the substrate 600. Source/drain regions (not shown) are formed on the substrate 600 by an ion implantation process. A spacer (not shown) is formed on a sidewall of the gate electrode to form a transistor structures.

A first insulating interlayer 610 is formed on a resultant structure. Tungsten layer 620 is formed on the first insulating interlayer 610. Since tungsten readily reacts with oxygen, a first native oxide layer 625 is formed on the surface of the tungsten layer 620.

Figure 6B:
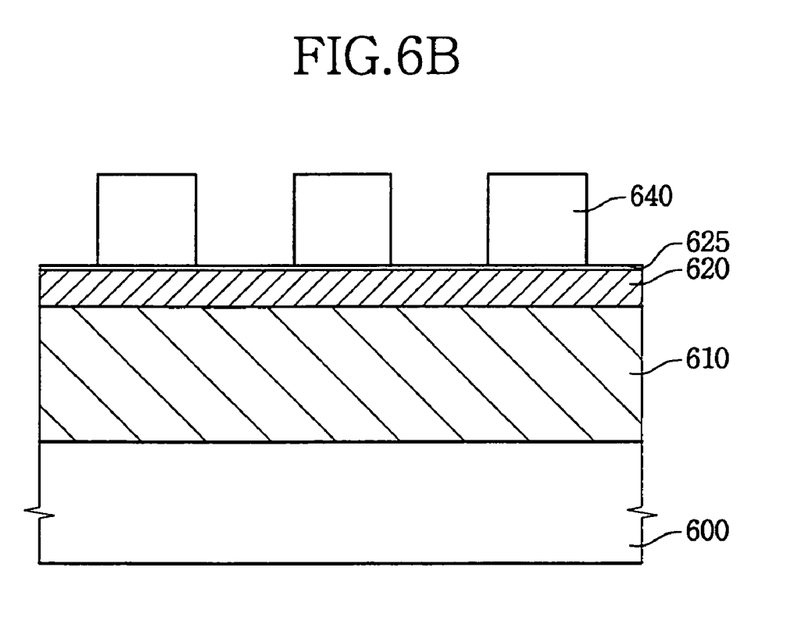

Referring to FIG. 6B, a photoresist pattern 640 is formed on first native oxide layer 625.

Figure 6C:
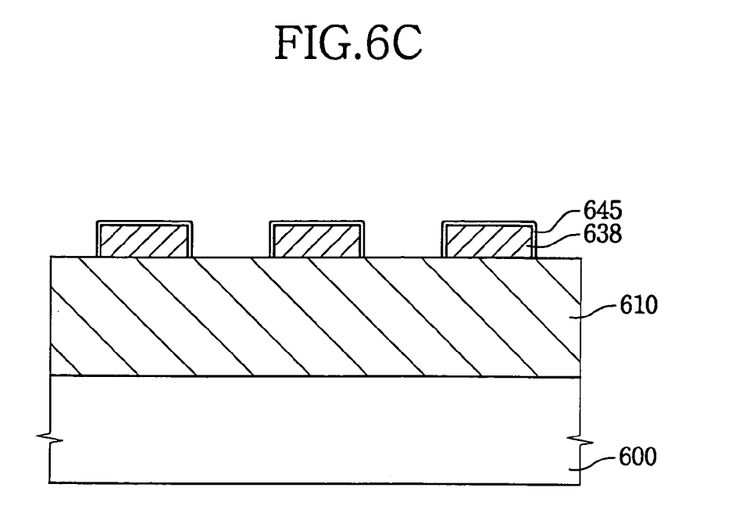

Referring to FIG. 6C, the first native oxide layer 625 and the tungsten layer 620 are etched using the photoresist pattern 640 as an etching mask for exposing an upper face of the first insulating interlayer 610 to form a bit line 638 including tungsten. Alternatively, the bit line 638 may be formed using a hard mask pattern.

The photoresist pattern 640 is removed by a dry ashing process. A second native oxide layer 645 including tungsten oxide is formed on an upper face and a side face of the bit line 638.

Generally, the photoresist pattern 640 may be removed by a dry etching process using an oxidizer, for example, such as oxygen or ozone. However, the oxidizer may be provided to the photoresist pattern 640 at a temperature of above about 100° C. so that a second native oxide layer 645 is formed on the side face of the bit line 638. When the second native oxide layer 645 is thermally treated continuously, oxide contained in the second native oxide layer 645 abnormally grows to form a whisker that causes an electrical short between adjacent a conductive pattern and the bit line 638.

Figure 6D:
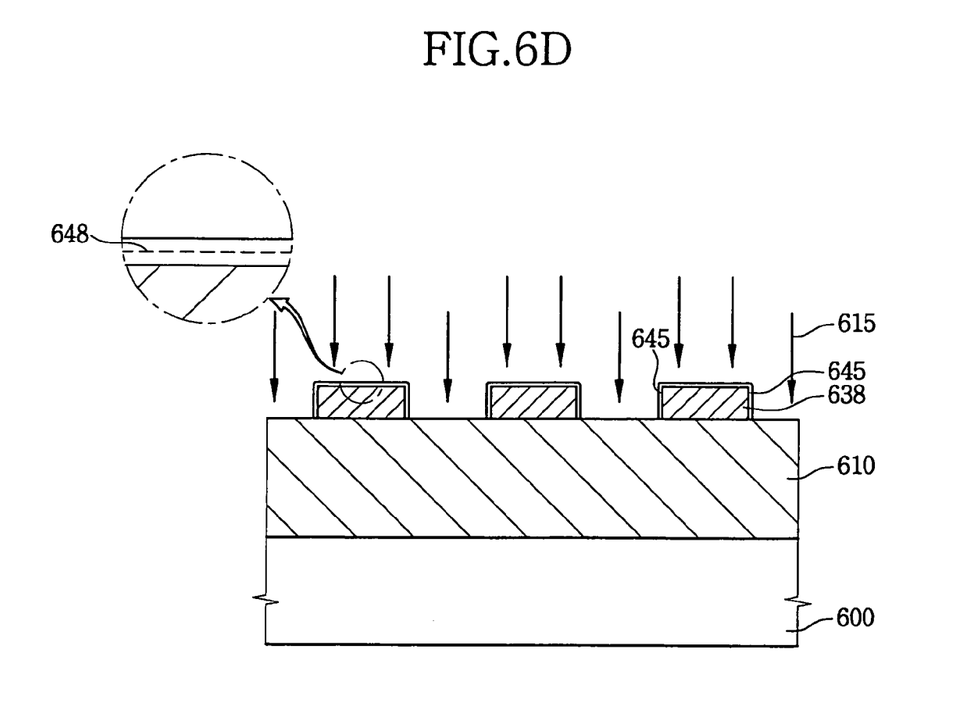

Referring to FIG. 6D, a silane gas 615 is introduced onto the bit line 638 at a flow rate of about 10 sccm to about 1,000 sccm at a temperature of about 300° C. to about 600° C. Silicon contained in the silane gas 615 is reacted with a surface of the bit line 638 through the second native oxide layer 645 to form a protecting layer 648 that includes silicon and has a thickness of about 1 Å to about 100 Å on the bit line 638. The protecting layer 648 is formed between the bit line 638 and the second native oxide layer 645.

Figure 6E:
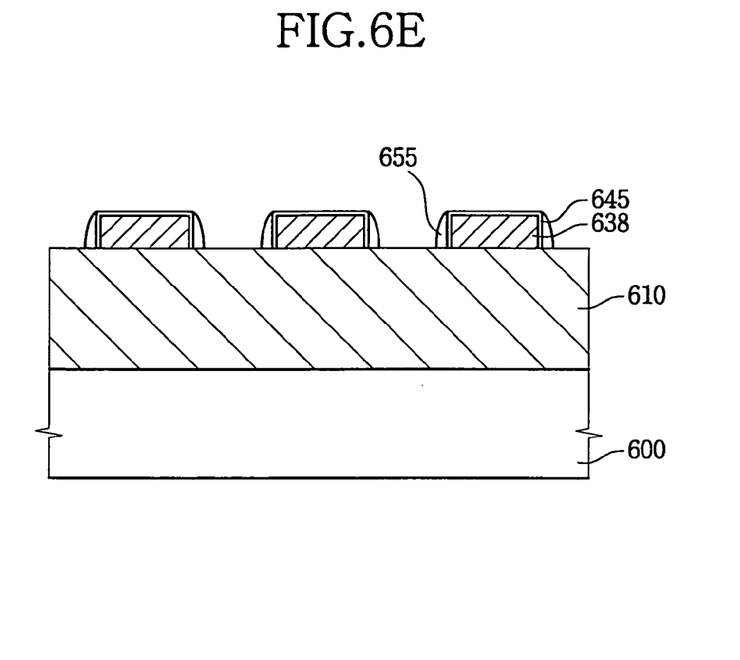

Referring to FIG. 6E, an insulating layer including silicon oxide or silicon nitride, is formed on the bit line 638 and the first insulating interlayer 610. The insulating layer is anisotropically etched to form a bit line spacer 655 on a sidewall of the bit line 638. When a thermal process for forming the bit line spacer 655 is performed, the growth of oxide contained in the second native oxide layer 645 is restricted by the protecting layer 648, thereby preventing the formation of a whisker on the bit line 638.

Figure 6F:
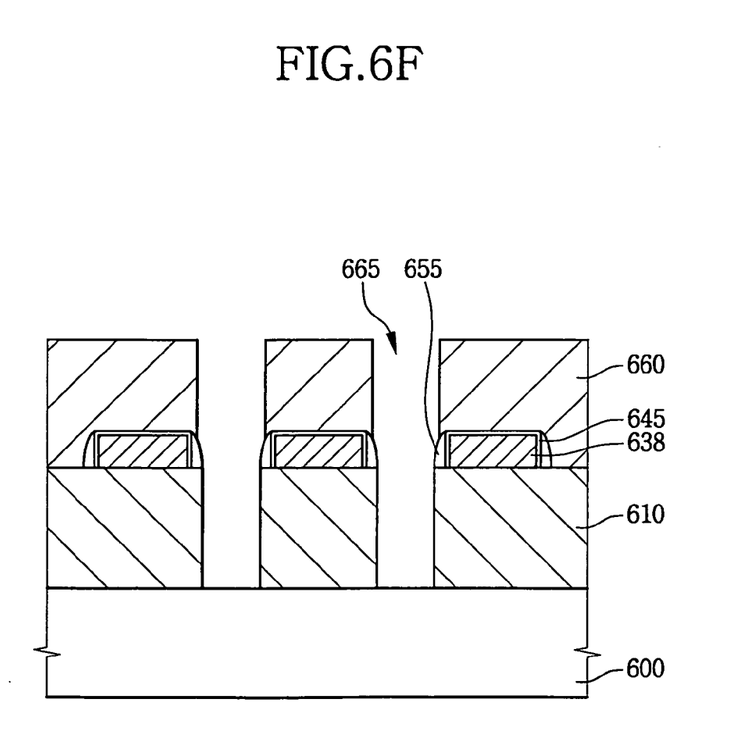

Referring to FIG. 6F, a second insulating interlayer 660 is formed on the bit line 648 and the first insulating interlayer 610. The first and second insulating interlayers 610 and 660 are partially etched by a photolithography process to form a contact hole 665 exposing the surface of the substrate 600. Here, the bit line spacer 655 is disposed between the contact hole 665 and the bit line 638.

Figure 6G:
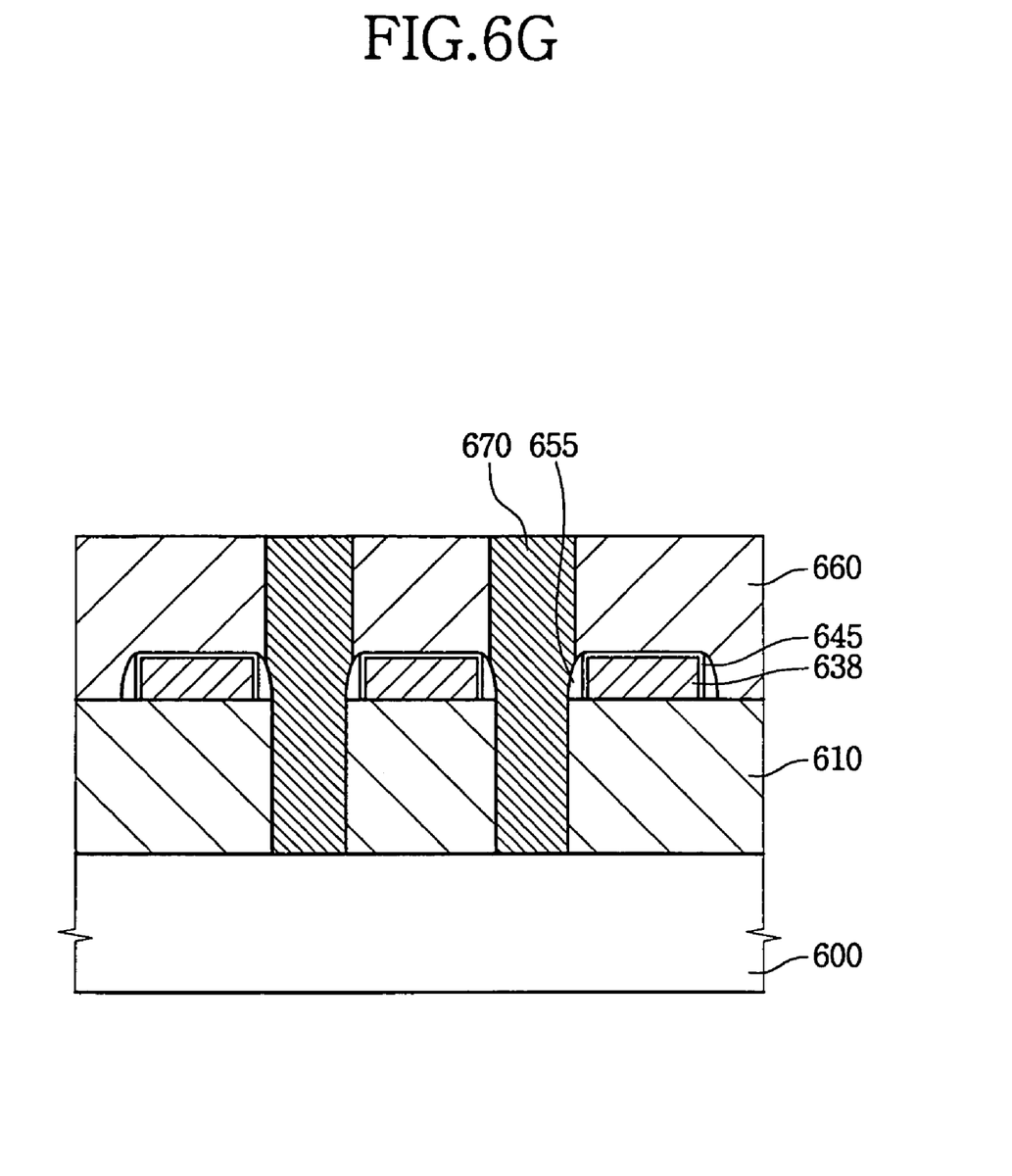

Referring to FIG. 6G, a conductive layer is formed on the second insulating layer 660 to fill the contact hole 665. The conductive layer is planarized for exposing an upper face of the second insulating interlayer 660 to form a contact plug 670 in the contact hole 665.

Figure 7A:
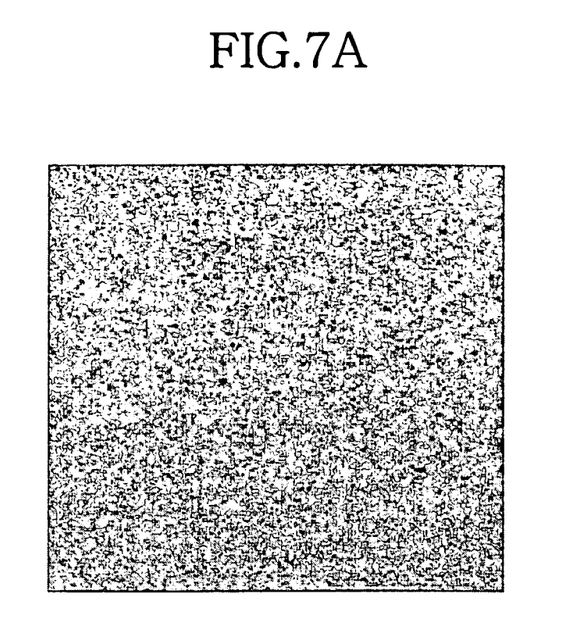
FIG. 7A is an SEM picture showing a surface of a tungsten layer pattern according to one embodiment of the present invention.

FIG. 7A is an SEM picture showing a surface of a tungsten layer pattern according to one embodiment of the present invention.

As shown in FIG. 7A, although the surface of the tungsten layer pattern was oxidized, a whisker was not formed on the surface of the tungsten layer pattern because the protecting layer was formed on the surface of the tungsten layer pattern.

Figure 7B:
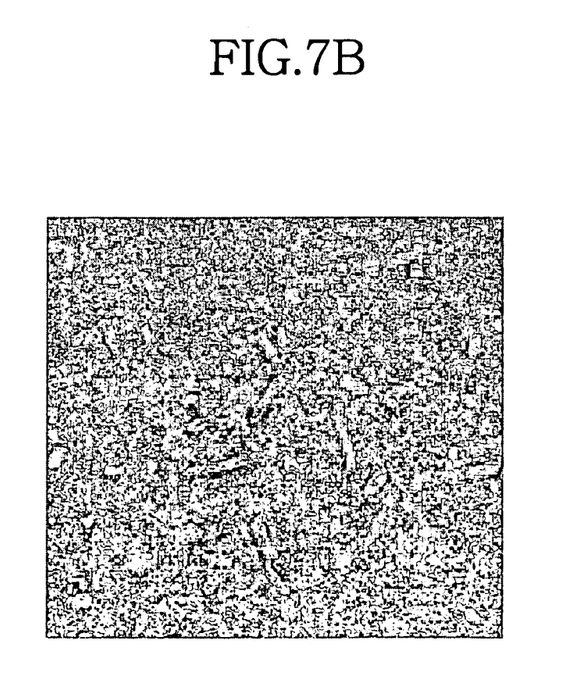
FIG. 7B is an SEM picture showing a surface of a tungsten layer pattern according to comparative example.

FIG. 7B is an SEM picture showing a surface of a tungsten layer pattern according to Comparative Example.

As shown in FIG. 7B, a whisker was irregularly formed on the surface of the tungsten According to embodiments of the present invention, the protecting layer is formed on the exposed surface of the tungsten layer pattern, thereby preventing the formation of the whisker on the surface of the tungsten layer pattern. Thus, the tungsten layer pattern may be not electrically connected to the conductive pattern via the whisker. Therefore, the tungsten layer pattern may be completely insulated from the conductive pattern.

As described above, in the method of the present invention, the silicon gas is introduced onto the oxidized surface of the tungsten layer pattern to form the protecting layer on the tungsten layer. The protecting layer may prevent the formation of the whisker on the surface of the tungsten layer pattern.

Therefore, when a conductive pattern is disposed adjacent to the tungsten layer pattern, an electrical short between the conductive pattern and the tungsten layer pattern may not occur.

Having described the preferred embodiments for forming the dielectric layers, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method of manufacturing a semiconductor device comprising:
    forming a tungsten layer pattern having an oxidized surface on a substrate;
    introducing a source gas including silicon into the oxidized surface of the tungsten layer pattern to form a protecting layer that prevents an abnormal growth of oxide contained in the oxidized surface of the tungsten layer pattern, wherein introducing the source gas to form the protecting layer includes
        applying energy to the source gas to form silicon ions, and
        implanting the silicon ions to the oxidized surface of the tungsten layer pattern; and
    thermally treating the substrate.

2. The method of claim 1, further comprising forming a tungsten oxide layer on the oxidized surface of the tungsten layer pattern.

3. The method of claim 2, wherein the tungsten oxide layer is formed by a thermal process.

4. The method of claim 1, wherein forming the protecting layer comprises:
    maintaining a temperature of the substrate including the tungsten layer pattern in a range of about 300° C. to about 600° C.; and
    introducing a silane gas onto the oxidized surface of the tungsten layer pattern at a flow rate of about 10 sccm to about 1,000 sccm to react with the oxidized surface of the tungsten layer pattern.

5. The method of claim 1, wherein the substrate is thermally treated at a temperature of about 300° C. to about 1,100° C.

6. The method of claim 1, wherein the protecting layer has a thickness of about 1 Å to about 100 Å.

7. A method of manufacturing a semiconductor device comprising:
    forming a photoresist pattern on a tungsten layer that is formed on a substrate;
    selectively etching the tungsten layer using the photoresist pattern as an etching mask to form a tungsten layer pattern on the substrate;
    removing the photoresist pattern;
    introducing a source gas onto a surface of the tungsten layer pattern, the source gas including silicon;
    applying energy to the source gas to form silicon ions;
    implanting the silicon ions into the surface of the tungsten layer pattern to form a protecting layer that prevents an abnormal growth of oxide; and
    thermally treating the substrate.

8. The method of claim 7, wherein the photoresist pattern is removed by an ashing process and a stripping process.

9. The method of claim 7, wherein forming the protecting layer further comprises:
    maintaining a temperature of the substrate including the tungsten layer pattern in a range of about 300° C. to about 600° C.; and
    introducing a silane gas onto the tungsten layer pattern at a flow rate of about 10 sccm to about 1,000 sccm to react the silicon with the tungsten layer pattern.

10. The method of claim 7, wherein the substrate is thermally treated at a temperature of about 300° C. to about 1,100° C.

11. The method of claim 7, wherein the protecting layer has a thickness of about 1 Å to about 100 Å.

12. The method of claim 7, further comprising an insulating layer formed on the substrate including the tungsten layer pattern.

13. A method of manufacturing a semiconductor device comprising:
    a step forming a tungsten layer pattern having a oxidized surface on a substrate;
    a step for forming a protecting layer on the oxidized surface of the tungsten layer pattern that prevents an abnormal growth of oxide, the step for forming the protecting layer including
        introducing a source gas including silicon on the oxidized surface of the tungsten layer pattern,
        applying energy to the source gas to form silicon ions, and implanting the silicon ions to the oxidized surface of the tungsten layer pattern; and a step for thermally treating the substrate.

14. The method of claim 13, further comprising a step for forming a tungsten oxide layer on the oxidized surface of the tungsten layer pattern.

15. The method of claim 14, wherein the step for forming the tungsten oxide layer comprises a thermal process.

16. The method of claim 13, wherein the step for forming the protecting layer comprises:

a step for maintaining a temperature of the substrate including the tungsten layer pattern in a range of about 300° C. to about 600° C.; and a step for introducing a silane gas onto the oxidized surface of the tungsten layer pattern at a flow rate of about 10 sccm to about 1,000 sccm.

17. The method of claim 13, wherein the step for forming the tungsten layer pattern comprises thermally treating the substrate at a temperature of about 300° C. to about 1,1000° C.

18. The method of claim 13, wherein the step for forming the protecting layer comprises forming the protecting layer to a thickness of about 1 Å to about 100 Å.

* * * * *

UNITED STATES PATENT AND TRADEMARK OFFICE
CERTIFICATE OF CORRECTION

PATENT NO. : 7,135,407 B2  Page 1 of 1
APPLICATION NO. : 10/816989
DATED : November 14, 2006
INVENTOR(S) : Ju-Cheol Shin et al.

It is certified that error appears in the above-identified patent and that said Letters Patent is hereby corrected as shown below:

Column 1, line 56, the word "W18049" should read -- W18O49 --;
Column 8, line 58, the words "a oxidized" should read -- an oxidized --.

Signed and Sealed this

Twelfth Day of August, 2008

JON W. DUDAS
*Director of the United States Patent and Trademark Office*